United States Patent
Day et al.

(10) Patent No.: US 6,576,382 B2
(45) Date of Patent: Jun. 10, 2003

(54) COMPOSITION FOR PHOTOIMAGING

(75) Inventors: Richard Allen Day, Whitney Point, NY (US); David John Russell, Apalachin, NY (US); Donald Herman Glatzel, New Milford, PA (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 10/142,018

(22) Filed: May 9, 2002

(65) Prior Publication Data

US 2002/0177072 A1 Nov. 28, 2002

Related U.S. Application Data

(63) Continuation of application No. 08/477,373, filed on Jun. 7, 1995, now abandoned, which is a continuation-in-part of application No. 07/976,115, filed on Nov. 13, 1992, now Pat. No. 5,439,766, which is a continuation-in-part of application No. 07/793,889, filed on Nov. 18, 1991, now Pat. No. 6,180,317, which is a continuation-in-part of application No. 07/632,032, filed on Dec. 21, 1990, now abandoned, which is a continuation-in-part of application No. 07/318,536, filed on Mar. 3, 1989, now Pat. No. 5,026,624.

(51) Int. Cl.[7] .................... G03F 7/004; C08G 59/20
(52) U.S. Cl. ............ 430/18; 430/280.1; 430/311; 428/901; 522/101; 522/102; 525/524; 525/482
(58) Field of Search ................. 430/280.1, 18; 522/101, 102; 428/901; 525/524, 482

(56) References Cited

U.S. PATENT DOCUMENTS

| | | | | |
|---|---|---|---|---|
| 4,465,760 A | * | 8/1984 | Leyrer et al. | 430/325 |
| 4,479,983 A | * | 10/1984 | Appelt et al. | 427/54.1 |
| 4,693,961 A | * | 9/1987 | Bauer | 430/325 |
| 4,911,786 A | | 3/1990 | Kindl et al. | 156/659.1 |
| 5,026,624 A | | 6/1991 | Day et al. | 430/280.1 |
| 5,264,325 A | | 11/1993 | Allen et al. | 430/280.1 |
| 5,278,010 A | | 1/1994 | Day et al. | 430/18 |
| 5,300,402 A | | 4/1994 | Card, Jr. et al. | 430/280.1 |
| 5,304,457 A | | 4/1994 | Day et al. | 430/280.1 |

* cited by examiner

Primary Examiner—Cynthia Hamilton
(74) Attorney, Agent, or Firm—William N. Hogg

(57) ABSTRACT

An improved photoimagable cationically polymerizable epoxy based solder mask is provided that contains a non-brominated epoxy resin system and from about 0.1 to about 15 parts, by weight per 100 parts of resin system, of a cationic photoinitiator. The non-brominated epoxy-resin system has solids that are comprised of from about 10% to about 80% by weight, of a polyol resin having epoxy functionality; from about 0% to about 90% by weight of a polyepoxy resin; and from about 25% to about 85% by weight of a difunctional epoxy resin. The photosensitive cationically polymerizable epoxy based system is especially useful as a solder mask and does not contain bromine.

12 Claims, No Drawings

COMPOSITION FOR PHOTOIMAGING

RELATED APPLICATIONS

This is a continuation of application Ser. No. 08/477,373, filed Jun. 7, 1995 now abandoned, which is a continuation-in-part of application Ser. No. 07/976,115, filed Nov. 13, 1992, now Pat. No. 5,439,766, which is a continuation-in-part of application Ser. No. 07/793,889, filed Nov. 18, 1991 now U.S. Pat. No. 6,180,317, which is a continuation-in-part of application Ser. No. 07/632,032, filed Dec. 21, 1990, now abandoned, which is a continuation-in-part of application No. 07/318,536, filed Mar. 3, 1989, now U.S. Pat. No. 5,026,624.

FIELD OF THE INVENTION

This invention relates generally to photoimagable compositions, and more particularly to a solder mask having cationically polymerizable non-brominated epoxy resin system.

BACKGROUND OF THE INVENTION

There are many different instances where photoimagable solder masks are used in various industrial processes. In one particular process the solder mask is applied to printed circuit board, then photolithographic techniques are employed to reveal various underlying structures on the board while masking others so that solder may be applied to the exposed structures. During the solder applying process the solder will adhere to the exposed underlying components and be prevented from adhering where the remaining material operates as a solder mask.

It is necessary that the solder mask material be formulated such that it possesses rheological properties for effective coating. Further, the solder mask must permit efficient transmission of the light or other exposing radiation so as to photolyze the photoinitiator through whatever thickness of material is applied. Also, of course, the solder mask must possess appropriate physical and chemical properties to withstand the application of the solder without significant deterioration or degradation and maintain its coverage over the portions of the board wherein solder is to be masked.

There have been many prior art proposals for different photoimagable compositions including many that use epoxies.

Examples of these are found in the following U.S. Pat. Nos.: 4,279,985; 4,548,890; 4,351,708; 4,138,255; 4,069,055; 4,250,053; 4,058,401; 4,659,649; 4,544,623; 4,684,671; 4,624,912; 4,175,963; 4,081,276; 4,693,961; and 4,442,197. All of these patents show various resins and photoinitiators for use in photoimagable compositions many of which are useful as solder masks. However none of them teach or suggest the specific composition of the present invention.

SUMMARY OF THE INVENTION

According to the present invention, an improved photo-imagable cationically polymerizable epoxy based solder mask is provided that contains a non-brominated epoxy resin system and from about 0.1 to about 15 parts, by weight per 100 parts of resin system, of a cationic photoinitiator. The non-brominated epoxy resin system has solids that are comprised of from about 10% to about 80% by weight, of a polyol resin having epoxy functionality; from about 0% to about 90% by weight of a polyepoxy resin; and from about 25% to about 85% by weight of an difunctional epoxy resin.

Since the photosensitive cationically polymerizable epoxy based solder mask does not contain bromine, it is particularly advantageous halogens in waste processing chemicals or in incinerated scrap circuit boards are regulated by environmental concerns. The photosensitive cationically polymerizable non-brominated epoxy based solder mask has a glass transition temperature greater than about 100° C., preferably greater than about 110° C. The solder mask dries to a tack-free film; thus, artwork used in the photoimaging process will not stick to the dried soldermask film.

The polyol resin which is a condensation product of epichlorohydrin and bisphenol A, has a weight average molecular weight of between about 40,000 and 130,000. The polyepoxy resin is an epoxidized multi-functional bisphenol A formaldehyde novolak resin having a weight average molecular weight of 4,000 to 10,000. The epoxidized diglycidyl ether of bisphenol A has two epoxide groups per molecule, a melting point of between about 80° C. and about 110° C. and a weight average molecular weight of between about 600 and 2,500. The invention also relates to a cationically polymerized solder mask.

DETAILED DESCRIPTION OF THE INVENTION

The present invention provides a photoimagable solder mask which comprises a cationically polymerizable epoxy resin system and a photoinitiator. The solder mask is stable at 320° C. for 30 minutes and has a glass transition temperature greater than about 100° C., preferably greater than about 110° C., more preferably about 120° C. The photoimageable solder mask is applied to a substrate by conventional coating techniques such as roller coating, wound wire rod coating and curtain coating, for use as a solder mask. However, the photo solder mask can be used for other applications, such as an etch mask, permanent plating resist or protective coating. In this particular solder mask application, the photoimagable solder mask is typically coated by conventional coating techniques onto substrate to a thickness of about 0.5 to about 4.0 mils or more, dried, photoimaged and developed. The developed areas reveal the desired underlying metallized portions of the substrate wherein solder is to be applied, and the remaining solder mask material is cured and remains on the board as a solder mask during the application of solder by any conventional technique. Thus, the system of this invention must have satisfactory rheological properties for application techniques, it must be sensitive to exposure to radiation, which conventionally is in the 330 to 700 nm region, without any significant absorption to thereby allow penetration of the exposure radiation completely through the film; and it must also have the necessary physical and chemical properties to resist degradation during the soldering process.

For many applications the solder mask remains on the board after soldering. In formulating such a coating there are many competing factors that must be considered in order to provide a desired end product. No specific type of epoxy resin has been found which will satisfy all of the various requirements; however, a formulation of a combination or mixture of various epoxy resins according to this invention provides the required properties for a curtain coatable photoimagable solder mask composition.

The photosensitive epoxy solder mask comprises about 100 parts of non-brominated cationically polymerizable epoxy-resin system and about 0.1 to 15 parts by weight, of a cationic photoinitiator. The non-brominated epoxy resin system comprises between about 10% and about 80% by weight of a polyol resin of a high molecular weight and having epoxy functionality; between about 0% and about 90% by weight of a polyepoxy resin of a medium molecular weight; from about 25% to about 85% by weight of a difunctional, solid, low melting point epoxy resin. The epoxy resin system is characterized in that it does not contain brominated resins. The cationic photoinitiator is capable of initiating polymerization in the non-brominated epoxidized resin system upon exposure to actinic radiation. Preferably, the non-brominated resin system is further characterized by having an absorbance of light in the 330 to 700 nm region of less than 0.1 for a 2 mil thick film.

The Non-Brominated Epoxy Resin System

In general, the non-brominated epoxy resin system contains a phenoxy polyol resin which is a condensation product of epichlorohydrin and bisphenol A, herein also referred to as the "polyol resin". The weight average molecular weight of the polyol resin is between about 40,000 and about 130,000 preferably from about 60,000 to about 90,000 and a weight per epoxide of from about 20,000 to about 65,000, preferably about 30,000 to about 45,000. Preferably the polyol resin is a difunctional epoxy resin. A suitable resin of this type was formerly sold by Union Carbide Corporation under the trademark PKHC and is currently sold by Phenoxy Resins Incorporated, also under the trademark PKHC. This resin has an epoxide value of about 0.03 equivalents per kg, a weight per epoxide of about 37,000, and a Tg, that is, glass transition temperature, of about 98° C.

The second resin in the system, although optional, is preferred. The second resin is an epoxidized multi-functional bisphenol A formaldehyde novolak resin with a medium range molecular weight and at least about 3 epoxy groups per molecule, also referred to herein as the "poly-epoxy resin": The weight average molecular weight of the polyepoxy resin is between about 4,000 and about 10,000 preferably from about 5000 to about 7000 and the weight per epoxide is from about 180 to about 500, preferably from about 190 to about 250. A suitable resin of this type formerly sold by Hi-Tek Polymers under the Trade Mark EpiRez© SU-8, is now sold by Shell Chemical Company, Houstan Tex., under the trademark Epon© SU-8. This resin is an octa-functional resin and has an epoxide value of about 4.7 equivalents per kg, a weight per epoxide of about 215, a melting point of about 82° C. and a Tg of about 210° C., in its fully cured state.

The third resin in the system, which is solid at 20° C., is a difunctional, epoxidized diglycidyl ether of bisphenol A, having a molecular weight of generally about 600 to 2,500 and preferably about 1,000 to 2,000 and a weight per epoxide of about 300 to about 1250, preferably about 500 to about 1000. This resin has a melting point of from about 80° C. to about 110° C. A suitable resin of this type formerly sold by High-Tek Polymers Corporation under the Trade Mark EpiRez® 522-C, is now sold by Shell Chemical Company, Houstan Tex., under the trademark Epon© 1002 F. This resin has a weight per epoxide of about 587, a weight average molecular weight of about 1174, and a melting point of about 86° C. Other suitable epoxy resins include, for example, D.E.R. 664, D.E.R. 667, D.E.R. 668 and D.E.R. 6695 from Dow Chemical, and another resin, formerly sold by High-Tek under the trademark EpiRez® 530-C resin, which is now sold by Shell Chemical Company under the trademark Epon© 1004 F. Epi-Rez® 530-C has a melting point 100° C. and a weight per epoxide of about 900.

It has been found generally that from about 10% to 80%, preferably 20% to 40% and more preferably 25% to 35% of the polyol resin can be used. About 0 to 90% preferably about 20% to 35% and more preferably 25% to 30% of the polyepoxy resin can be used. About 25% to 80% of the difunctional solid epoxidized bisphenol A resin is used. Preferably about 60% to about 80% of the difunctional solid epoxidized bisphenol A is desireable were no polyepoxy is used and preferably about 37% to about 47% of the difunctional solid epoxidized bisphenol A the polyepoxy resin is used.

The specific composition is selected to optimize the desired properties. For example, the polyol resin controls the rheology of the coated materials while the difunctional solid epoxy and the polyepoxy impart fast photo speed, improved resolution and glass transition temperature. In selecting the specific amount of each resin it will of course be understood that by increasing the concentration of any one of the resins, this would also increase the respective property associated with it; however, increasing the concentration of any one of the specific resins would require a decrease in the concentration of one or both of the remaining resins which would result in a decrease of the function of the specific properties associated therewith. A decrease in any of the resins below the broad range percentages indicated above would result in properties which are unacceptable for the specific purpose of high resolution photoimagable solder mask material.

As the polyol resin amount is decreased, the resulting rheology results in a reduced coverage when the material is applied and the resulting material is extremely brittle. Varying the multi-functional epoxy resin concentration or the solid difunctional epoxy resin concentration affects both the resolution and photospeed. Also, increasing the solid difunctional epoxy resin concentration increases the compatability of the components of the resin system. Thus, in balancing the formulation of the material, all of these requirements must be considered and the end product optimized to give satisfactory properties for the result desired.

The Photoinitiator

The cationic photoinitiator is capable of initiating polymerization of the non-brominated epoxy resin system upon exposure to actinic radiation. A photoinitiator-such as various sulfonium salts, iodonium salts, and ferrocene salts is added to the resin system for providing the proper photo-response to actinic radiation. Since the resin system is cationically photocurable, the photoinitiator must be capable of causing cationic polymerization of the resin upon exposure to radiation. One particularly desirable photoinitiator is a complex triarylsulfonium hexafluoroantimonate salt formerly sold by General Electric Company under the trademark UVE 1014, and presently sold by Union Carbide under the trademark Cyracure UVI-6974.

Other photoinitiators such triphenylsulfonium hexafluorophosphate sold by General Electric Co. under the Trade Mark UVE 1016, and diphenyliodonium hexafluoroantimate may be used.

From about 0.1 and about 15 parts by weight of the photoinitiator based on 100 parts of the resin system are normally what is required. (It is conventional practice in the art of photoimaging to designate the percentage of the components of the resin system to add up to 100% and to designate the additions or additives thereto in values of parts by weight based on 100 parts of the resin system, and this convention is adopted herein.)

Solvent

To obtain the necessary viscosity for applying the photo-imagable solder mask composition, the photoimageable solder mask composition contains a solvent. The amount of solvent depends upon the coating method. For curtain coating the photoimageable solder mask composition preferably contains about 40% solids in the solvent. For wire rod coating the photoimageable solder mask composition preferably contains about 30% to about 50% solids more preferably about 40% solids in the solvent. The preferred solvent is propylene glycol monomethyl ether acetate (PGMEA). Other moderately polar solvents can be used such as propylene glycol monomethyl ether, 2-methoxyethanol, 2-methoxyethyl acetate, 2-ethxyethyl acetate, N-methyl pyrrolidone, propylene carbonate, or gammabutyrolactone.

Optional Ingredients

For some applications, certain additives to the formulation may be desired. Optionally a photosensitizer such as anthracene or its derivatives or perylene or its derivatives can also be added which may increase the response speed of photoimaging and/or the wavelength sensitivity. Optionally up to about 10 parts by weight of a photosensitizer, based on 100 parts of the resin system, can be used. A fluorescent or color dye may be added for inspection or cosmetic purposes. For some coating applications, it may be desirable to use a surfactant, e.g. Fluorad FC 430 sold by 3M Corp. It will, of course, be understood that the additive must not significantly degrade the other properties of the coating.

EXAMPLE 1

A solder mask composition was prepared by combining 28.5 parts of the phenoxy resin PKHC, 24 parts of the multifunctional epoxy resin Epi-Rex® SU-8, 43 parts of the difunctional, diglycidal ether of Bisphenol A, Epi-Rez® 522-C, and 5 parts of the cationic photoinitiator UVE 1014. The solids content was adjusted to 40% with PGMEA solvents, and the mixture was stirred for about 5 hours to provide a photoimageable coatable solder mask. The mixture was coated by wound wire rod draw down onto substrates, specifically copper clad NIPS, and dried to obtain a tack free film.

EXAMPLE 2

A solder mask composition was prepared as in Example 1, except that 28 parts of the phenoxy resin PKHC, 67 parts of the difunctional, diglycidal ether of Bisphenol A, Epi-Rez® 522-C, and no Epirez® SU-8 were used.

EXAMPLE 3

A solder mask composition was prepared as in Example 1, except that 28.8 parts of the phenoxy resin PKHC, 24 parts of the multifunctional epoxy resin Epi-Rex® SU-8, and 43 parts of the difunctional, diglycidal ether of Bisphenol A, Epi-Rez® 530-C were used.

EXAMPLE 4

A solder mask composition was prepared as in Example 1, except that 28.8 parts of the phenoxy resin PKHC, 24 parts of the multifunctional epoxy resin Epi-Rex® SU-8, and 43 parts of the difunctional, diglycidal ether of Bisphenol A, D.E.R. 664 were used.

COMPARATIVE EXAMPLE A

A solder mask composition was prepared for 30 parts of the polyol PKHC resin, 45 parts of Epirez 5183 from High-Tek Polymers now sold by Shell Chemical Company, under the trademark Epon© 1183, 25 parts Epirez® SU-8, 5 parts photoinitiator, 0.05 pph ethyl violet dye and 0.03 pph of the surfactant Fluorad FC 430 were mixed and applied as above in Example 1.

Evaluation

The films of Examples 1–4 and Comparative Example A were cured using UV light of 330–450 nm with heat at 150° C. for 60 minutes to provide a solder mask. The films were then evaluated and examined for resolution, solder shock, glass transition temperatures, % weight loss upon heating and step wedge. The results are shown below in Table I.

To determine the thermal stability, that is, the percent loss of the soldermask composition upon heating, the films were heated to 320° C. for 30 minutes while the weight of the film samples was continuously monitored using thermal gravimetric analysis.

The solder mask films of Example 1–4 and Comparative Example were also photoimaged, developed and the resolution examined. Specifically, the solder mask material was exposed to UV radiation from a medium pressure mercury lamp. The UV radiation was passed through a phototool which is opaque in those area where the solder mask is to be removed. The exposure dose was monitored using a Stauffer 21 step wedge. After exposure to UV radiation, the substrates were baked for a short time to accelerate the crosslinking reaction initiated by the sulfonium salt photolysis products. Bake temperatures of about 125° C. were used although temperatures between 100° C. and 150° C. are suitable. Bake times of 30 minutes were used although times between 2 and 45 minutes are suitable. The solder mask was then developed using a solvent that easily dissolves any unexposed material. The developer used was propylene carbonate, although DY90 sold by Ciba-Geigy which contains gamma butyrolactone, propylene carbonate, and diglyme or butyrolactone also work well as a developers. Spray developing equipment and developer solution was used. The solder mask was cured by exposing the solder mask to UV radiation followed by an oven bake at 150° C. UV doses were 4 Joules/sq cm. Bake times were 60 minutes although times from 30 to 90 minutes are suitable.

During the photoimaging process, the light penetrated essentially completely through the coating to the underlying structure; thus the coating exclusive of the photoinitiator and =sensitizer was transparent to this particular light, i.e. had an absorbance of less than 0.1 for the 2.0 mil thick film.

Examples 1–5 and Comparative Example A were tested for solderability in a conventional manner using the following "solder shocking" test which is a common method of testing solder mask performance under typical soldering stresses seen in industrial processes. The coated substrate is photoimaged, developed, and fully cured. The part is submerged in molten solder, maintained at 500° F.±25°, for 10–20 seconds. After the submersion into the solder, the part is allowed to cool to room temperature and inspected. Visual inspection for cracking, flaking, blistering, or noticeable degradation of the material is performed. If the solder shock does not physically degrade the material, as confirmed by visual inspection, then the solder mask passes the solder shock test criteria. The results are shown below in Table I.

TABLE I

| Example | Tg | Step Wedge | Resolution (mil.) | Thermal Stability (% Loss) | Solder Shock |
|---|---|---|---|---|---|
| 1 | 120 | 9.8 | 3.5 | 35 | Pass |
| 2 | 113 | 11.5 | 8.1* | 38 | Pass |
| 3 | 105 | 6.0 | 2.7 | 34 | Pass |

TABLE I-continued

| Example | Tg | Step Wedge | Resolution (mil.) | Thermal Stability (% Loss) | Solder Shock |
|---|---|---|---|---|---|
| 4 | 118 | 7.0 | 2.7 | 36 | Pass |
| Comp. A. | 128 | 8.0 | 2.2 | 39 | Pass |

*When applied, this Sample was very thick and may have contributed to loss of resolution.

As seen from Table 1, Examples 1–4 all passed the solder shock test. The higher the step wedge value, the more sensitive the coating is to the UV light. Accordingly, example 2 in Table I which has a value of 11.5, is about two times as fast as example 1, which has a value of 9.8, for the same exposure dose. Examples 1–4 had an acceptable resolution, although where fine resolution is desired, Example 2 is less preferred. Examples 1–4 demonstrate comprable or improved thermal stability as compared to the control sample.

After removing surface oxides such as with a dilute HCl rinse and applying an antioxidant such as benzotriazole, circuit boards are soldered using a variety of methods. Two of the processes used with solder mask described here are wave solder and vapor phase reflow of solder paste or infra red radiation reflow of solder paste.

The solder mask can be used for other purposes and may be applied by various other techniques. Where different uses and coating techniques are employed, certain modifications of the preferred material may be necessary to meet different requirements. For example, a different solvent may be desired for roller coating as opposed to wire coating and the rheological properties may be varied from the optimum for wire coating for the different types of uses.

While the invention has been described with a certain degree of particularity, various adaptations and modifications can be made without departing from the scope of the invention as defined in the appended claims.

What is claimed is:

1. A cationically polymerized non-brominated epoxy composition comprising:
    a. an epoxy resin system comprising:
        i. polymerized units of between about 10% and about 80% by weight of a polyol resin which is a condensation product of epichlorohydrin and bisphenol A having a weight average molecular weight of between about 40,000 and about 130,000;
        ii polymerized units of between about 0% and 35% by weight of an epoxidized multifunctional bisphenol A formaldehyde novolak resin having a weight average molecular weight of between about 4,000 and about 10,000; and,
        iii. polymerized units between about 25% and about 80% by weight of an epoxidized glycidyl ether of bisphenol A having a softening point of between about 60° C. and about 110° C. and a weight average molecular weight of between about 600 and about 2,500.

2. The composition as defined in claim 1 wherein the molecular weight of the polyol resin is between about 60,000 and about 90,000 and the weight per epoxide is from about 30,000 to 45,000; the molecular weight of the epoxidized multifunctional bisphenol A formaldehyde novolak resin is between about 5,000 and about 7,000 and the weight per epoxide is from about 190 to 250 and the molecular weight of the epoxidized glycidyl ether of bisphenol A is between about 1,000 and about 1,700 and the weight per epoxide is about 500 to 1000.

3. The composition of claim 1, wherein the composition is a solder mask.

4. A circuit board having disposed thereon the polymerized composition of claim 2.

5. A circuit board having disposed thereon the polymerized composition of claim 1.

6. The invention as defined in claim 4 wherein the composition is a solder mask.

7. The invention as defined in claim 5 wherein the composition is a solder mask.

8. The epoxy composition as defined in claim 1 wherein there is between about 20% and about 40% of the polyol resin, between about 20% and about 35% of the epoxidized multifunctional bisphenol A formaldehyde novolak resin; between about 37% and about 47% of the epoxidized diglycidyl ether of bisphenol A resin; and between about 2 and 6 parts by weight of a cationic photoinitiator.

9. The epoxy composition as defined in claim 1 wherein there is between about 20% and about 40% of the polyol resin, about 0% of the epoxidized multifunctional bisphenol A formaldehyde novolak resin; between about 60% and about 80% of the epoxidized diglycidyl ether of bisphenol A resin; and between about 2 and 6 parts by weight of a cationic photoinitiator.

10. The epoxy composition as defined in claim 8 wherein there is between about 25% and about 35% of the polyol resin, between about 20% and about 30% of the epoxidized multifunctional bisphenol A formaldehyde novolak resin.

11. The epoxy composition of claim 1 wherein the molecular weight of the polyol resin is greater than about 60,000.

12. The epoxy composition of claim 3 wherein the glass transition temperature of the solder mask composition is greater than 100° C.

* * * * *